United States Patent [19]

Eckes et al.

[11] Patent Number: 4,788,431
[45] Date of Patent: Nov. 29, 1988

[54] SPECIMEN DISTANCE MEASURING SYSTEM

[75] Inventors: William A. Eckes, Hayward; Lee Veneklasen, Castro Valley; Glen E. Howard, Pleasanton; Donald J. McCarthy, Hayward; Allen M. Carroll, Oakland; Daniel L. Cavan, Woodside, all of Calif.

[73] Assignee: The Perkin-Elmer Corporation, Norwalk, Conn.

[21] Appl. No.: 36,731

[22] Filed: Apr. 10, 1987

[51] Int. Cl.⁴ .................................... H01J 37/244
[52] U.S. Cl. ............................. 250/397; 250/310
[58] Field of Search ............... 250/397, 310, 491.1, 250/492.2; 219/121 EY

[56] References Cited

U.S. PATENT DOCUMENTS

3,876,879 4/1975 McAdams et al. ............... 250/310
4,137,459 1/1979 Allrecht et al. ................. 250/492.2

Primary Examiner—Bruce C. Anderson
Assistant Examiner—Jack I. Berman
Attorney, Agent, or Firm—Thomas P. Murphy; Edwin T. Grimes; Francis L. Masselle

[57] ABSTRACT

A specimen distance measuring system uses a plate (36) to obstruct the flux of backscattered electrons produced by an electron beam (18), and to cast a shadow across a measurement detector (32) which is sensitive to the position of the shadow. The shadow plate (36) and measurement detector (32) are aligned at an angle of approximately 45 degrees with a substrate (14) in order to allow calibration of the distance measuring system by scanning the electron beam (18). The measuring system is particularly useful as a height sensor (10) in an electron beam lithography apparatus (12) for sensing the height of a substrate (14). The distance measuring system may also include a reference detector (34) which is positioned in order to receive backscattered electron flux without obstruction from the shadow plate (36). The use of such a reference detector (32) is advantageous in allowing compensation of the signals obtained by the measurement detector, in order to allow the height sensor to operate independently of variations in electron beam current, and variations in substrate backscatter coefficient. The reference and measurement detectors (34,32) may be aligned in a vertical or horizontal plane to be either parallel to or perpendicular to the bombardment electron beam (18). Active feedback may be provided from the height sensor (10) to a vertical stage actuator for adjusting the height of the substrate (14).

18 Claims, 5 Drawing Sheets

SPECIMEN DISTANCE MEASURING SYSTEM

FIELD OF THE INVENTION

This invention relates generally to the field of electron beam instrumentation, and pertains more particularly to a height sensor for detecting the position of an object in an electron microscope or electron beam lithography apparatus through the measurement of the quantity of backscattered electron flux traveling past a shadow producing block.

BACKGROUND OF THE INVENTION

Electron beam lithography systems have been built in which an electron beam is projected vertically downwards onto a substrate which is mounted on a stage that is equipped to move vertically, and in both directions in a horizontal plane. Electric and magnetic fields are produced in electron optics in order to focus the electron beam vertically downwards on to the substrate. The electron optics also controls the deflection of the beam in order to allow for small deflections of the electron beam in the horizontal plane. One problem encountered with such electron beam devices is that the vertical distance between the electron optics and the substrate must be maintained substantially constant at a predetermined distance in order to maintain the focus of the electron beam on the substrate. Such a vertical distance, or height of the substrate, is also critical in order to insure that calibration and precision are preserved for the electron beam deflection produced in a horizontal plane by the electron optics. The problem of substrate height control is accentuated by distortions or flatness imperfections in the substrate. Such distortions may be caused by warping of the substrate during the chemical or thermal processing steps used in semiconductor device fabrication. The distortions may cause different areas of the substrate to be at different vertical heights when mounted on the electron beam lithography stage.

A variety of sensor devices have been used in order to detect the substrate height; that is, the vertical distance between the electron optics and the substrate. Such sensors have included light (photon) optics, capacitive sensors, and inductive sensors. A drawback with such prior sensors is that they are generally so large in size as to be cumbersome, and are expensive.

When an electron beam bombards a substrate, it produces high energy backscattered electrons and low energy secondary electrons which travel outwards from the impact region on the surface of the substrate. The backscattered electrons have approximately the same energy as bombardment electrons, and their energy is generally greater than one thousand volts.

The secondary electrons generally have an energy in the range of five to twenty volts.

The backscattered electrons travel in substantially straight lines. The flux of backscattered electrons is defined by a backscatter coefficient which varies with the composition and texture of the substrate upper surface. The backscattered electron flux also varies with the bombardment beam current. The intensity of the backscattered electron flux also varies with substrate irregularities such that localized sloping of the substrate upper surface causes backscattered electron flux to be directed toward or away from the direction of electron bombardment.

It is important not only that the substrate height be detected, but also that a method for adjusting the stage vertical position also be provided in order to move the substrate to a height satisfying the critical requirements of the electron beam system.

OBJECTS OF THE INVENTION

It is therefore an object of the invention to provide a sensor for detecting the position of a substrate in an electron beam microfabrication system or an electron microscope.

Another object of the invention is to provide a substrate height sensor in an electron beam system which is relatively insensitive to variations in the electron beam current, back scatter coefficient and landing angle.

A further object of the invention is to provide a substrate height sensor in an electron beam system in which the substrate height sensor is relatively insensitive to low energy secondary electron which are subject to scattering and magnetic effects.

Another object of the invention is to provide a substrate height sensor in the electron beam system in which the height sensor is highly accurate and relatively inexpensive.

A further object of the invention is to provide an electron beam system in which the stage height is automatically adjusted in response to the measured substrate height.

SUMMARY OF THE INVENTION

A substrate height sensor may be constructed using a shadow edge to produce a shadow in the flux of backscattered electrons which result when an electron beam is used to bombard a substrate. The height sensor also has a measurement detector positioned to intercept backscattered electrons and also positioned so that the shadow produced by the shadow edge falls across the measurement detector during operation. As the height of the substrate is changed, the position of the shadow moves across the measurement detector so that the amount of electron flux intercepted by the measurement detector varies. The measurement detector is connected to an electrical circuitry for measuring the electrical current resulting from the electron flux intercepted by the measurement detector. It is preferable that the measurement detector be positioned so that a nominal current is produced when the substrate is at a nominal working height. Deviations from the nominal current produced by the measurement detector may be used to indicate when the substrate is above or below its nominal working height. The height sensor may also have a reference detector which is positioned to receive backscattered electrons nearby the measurement detector, but positioned to be unaffected by the shadow produced by the shadow edge. Such a reference detector may be used in circuitry in which a comparison is made between the current produced by the measurement and reference detectors in order to compensate for variations in electron beam current or substrate composition. The measurement and reference detectors are preferably P/N diodes which are relatively insensitive to secondary electrons, but may comprise other forms of detectors. An electronic divider may be coupled to the measurement and reference detectors in order to produce an electrical signal which is the ratio of the measured and reference currents. This ratio signal may be applied to a comparator circuit in order to produce an electrical signal for display which indicates the deviation of the substrate height from the preferred substrate height. Active feedback may be used to automatically adjust the stage height in response to the measured substrate height.

DETAILED DESCRIPTION

Figure 1:
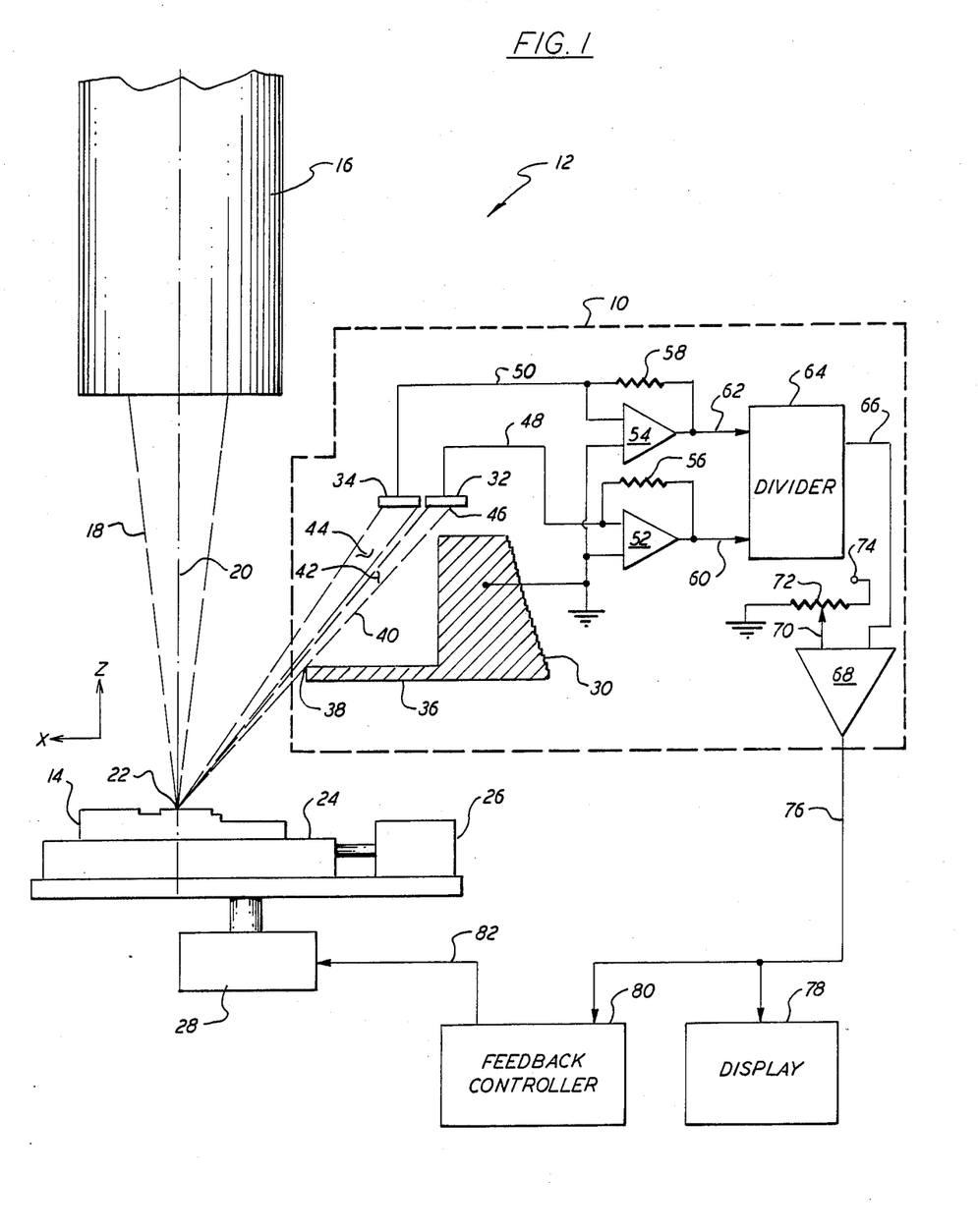
FIG. 1 is a partially cut away elevation view of the substrate height sensor as used in an electron beam microlithography system, and further showing an electrical schematic diagram for the circuitry used therein.

Referring first to FIG. 1, the height sensor 10 may be used as a part of an electron beam microlithography system 12 in order to detect the position of a specimen such as the substrate 14. The system 12 includes an electron optics column 16 which has a conventional electron gun source, deflecting plates, and electron beam lenses for producing a bombardment electron beam 18. The electron beam 18 has a centerline 20 and is focused to hit the substrate 14 in a small impact region 22 on the upper surface of the substrate 14. The beam 18 preferably has a current of 0.5 microamperes, a voltage of 20 keV, and produces a circular impact region 22 of approximately 2 micrometers in diameter. The electron beam 18 is used in the system 12 in order to expose a resist layer on the upper surface of the substrate 14, usually by polymerizing selected portions of the resist layer by electron bombardment. FIG. 1 is shown with reference axes X and Z. The electron beam 18 is projected vertically downwards with its centerline 20 parallel to the Z axis. The substrate 14 is a thin plate mounted horizontally, parallel to the X axis. The microlithography system 12 may be used to directly write circuit patterns on a semiconductor wafer used as the substrate 14 or may be used to produce patterns on a mask used as the substrate 14 so that the mask may be used in subsequent photolithographic steps for processing semiconductor wafers.

The substrate 14 is mounted on a movable stage 24. A horizontal stage actuator 26 is coupled to the stage 24 in order to move the stage 24 and substrate 14 in a horizontal direction parallel to the X axis. A similar Y axis stage actuator (not shown) is coupled to move the stage 24 in a horizontal direction perpendicular to the X axis. A vertical stage actuator 28 is mechanically coupled to the stage 24 in order to move the substrate 14 and stage 24 upwards and downwards vertically in a direction parallel to the Z axis.

The distance between the electron optics column 16 and the upper surface of the substrate 14 is particularly important in an electron beam microlithography system such as the system 12 illustrated in FIG. 1. The lenses and the deflection systems used in the column 16 are set to focus the beam 18 on the impact region 22 and to horizontally deflect the beam 18 in a plane perpendicular to the Z axis. The beam 18 will be properly focused and deflected by calibrated distances only when the substrate 14 is properly positioned in a predetermined vertical position (a nominal working height) by the actuator 28. In order to obtain satisfactory focus and horizontal deflection calibration, it is important that the height of the substrate 14 be adjusted to a tolerance ±1.0 micrometers. Variations of ±50 micrometers may be expected in the height of the substrate 14 as mounted on the stage 24 due to variations in the thickness and mounting of substrate 14.

The vertical stage actuator 28 may be a conventional mechanical micrometer or may be an electrically operated positioner. The actuator 28 is shown in FIG. 1 as an electrically operated positioner.

The height sensor 10 has a shadow producing block 30, a measurement detector 32, and a reference detector 34. The block 30 is preferably composed of an electron opaque metal material, such as molybdenum, which may be coated with a highly electrically conductive silver paint. The block 30 has a shadow plate 36 projecting therefrom in order to obstruct the flux of backscattered and secondary electrons leaving the upper surface of the substrate 14. The shadow plate 36 is positioned horizontally in a plane perpendicular to the Z axis. The shadow plate 36 has a shadow edge 38 which produces a beam edge 40 in the backscattered and secondary electrons traveling from the substrate 14. That is, electrons traveling towards the detectors 32 and 34 are obscured by the block 30 if such electrons have a trajectory beneath the beam edge 40, and are not obscured by the block 30 for electrons having a trajectory above the beam edge 40. Electrons having a trajectory from the impact region 22 to the measurement detector 32 travel inside the measurement path 42. Electrons traveling from the impact region 22 to the reference detector 34 travel inside the reference path 44. It is preferable that the beam edge 40 define the lower boundary for the measurement path 42.

The block 30, measurement detector 32, and reference detector 34 are preferably aligned and rigidly connected together, and attached to the electron optics column 16 to prevent relative movement between the optics column 16, block 30, and the detectors 32 and 34.

The detectors 32 and 34 are preferably elongated, spaced apart strips which are positioned in a horizontal plane perpendicular to the Z axis, and which are aligned parallel with the shadow edge 38. The detectors 32 and 34 may be composed of electrically conductive metal such as tantalum. It is preferable that the detectors 32 and 34 be P/N diode backscatter detectors of the conventional, commercially available type which are sensitive to backscattered electrons having a high energy and are relatively insensitive to low energy secondary electrons emitted by the substrate 14. Such diodes may include PIN diodes or photovoltaic cells of the conventional, commercially available type. Note that low energy secondary electrons may produce a diffuse shadow due to the fact that such secondary electrons may move through the beam edge 40 due to scattering and magnetic effects. As an alternative, the detectors 32 and 34 may be constructed using conventional scintillator-photomultiplier devices which make use of fiber optic light guides between scintillators located in the detectors 32 and 34 and remotely mounted photomultipliers. As a further alternative, the detectors 32 and 34 may be constructed of metallic conductors and may be further equipped with electrical biasing circuitry (not shown; but which may include conventional batteries) to place bias voltages on the detectors 32 and 34 in order to cause the detectors 32 and 34 to be selectively insensitive to low energy secondary electrons, yet remain sensitive to higher energy backscattered electrons.

The intersection of the beam edge 40 with the plane of the detectors 32 and 34 defines a detected edge 46 at the boundary between the backscattered electron flux and the shadow cast by the shadow plate 36. The sharpness of the detected edge 46 may be degraded by secondary electrons which may be scattered or deflected by magnetic fields, as explained above. It is preferable that the detected edge 46 fall on the undersurface of measurement detector 32 when the substrate 14 is at its nominal working height; thus exposing a portion of the measurement detector 32 to backscattered electron flux. The function of the measurement detector 32 is to measure the quantity of backscattered electron flux traveling past the shadow producing block 30 in order to indicate the vertical height of the impact region 22 on the substrate 14. It is preferable that the height sensor 10 be operated so that the reference detector 34 is entirely and continuously exposed to backscattered electron flux; thus making sure the reference detector 34 is not obstructed by the shadow plate 36. It is preferable that the detectors 32 and 34 be mounted closely together so that the relative amounts of electron flux intercepted by each is substantially insensitive to variations in the direction of the backscattered electron flux produced by, for example, localized irregularities in the upper surface of the substrate 14. Therefore, the angle subtended by the measurement path 42 and reference path 44 with respect to the impact region 22 is kept small and the electron flux in paths 42 and 44 undergo similar variations as the direction of backscattered electron flux varies.

The detectors 32 and 34 are connected by the conductors 48 and 50, respectively, to inverting inputs of operational amplifiers 52 and 54, respectively. The block 30, and the noninverting inputs of amplifiers 52 and 54 are connected to electrical ground. The gain determining feedback resistors 56 and 58 are connected between the outputs and inverting inputs of the operational amplifiers 52 and 54, respectively. The amplifier outputs 60 and 62 from the operational amplifier 52 and 54, respectively, are connected as inputs to a divider circuit 64. The divider circuit 64 produces a divider output 66 having a voltage which is proportional to the magnitude of the voltage on the output 60 divided by the magnitude of the voltage on the output 62. The divider output 66 is connected to the noninverting input of amplifier 68 which has its inverting input 70 connected to the slider of a potentiometer resistor 72. The potentiometer resistor 72 has one of its ends connected to ground and the other end connected to a terminal 74 to which a reference voltage source (not shown) is connected. The amplifier 68 produces an output 76 which is connected as an input to a display 78 and a feedback controller 80. The feedback controller 80 produces an output 82 which is connected as an input to the vertical stage actuator 28.

The amplifiers 52 and 54 are connected to amplify the currents detected by the detectors 32 and 34, respectively, in order to produce voltages on the outputs 60 and 62 proportional to the magnitude of electron flux intercepted by the detectors 32 and 34, respectively. The divider 64 produces a voltage on the output 66 which is proportional to the ratio of the electron flux intercepted by the detectors 32 and 34. The function of the divider 64 is to produce a signal on output 66 which is indicative of a comparison between the flux intercepted by detectors 32 and 34; with such a comparison being relatively insensitive to variations in the current of the bombardment beam 18, and to variations or irregularities in the upper surface of substrate 14. The amplifier 68 is connected to produce a voltage on the output 76 which is proportional to the reference voltage obtained on the input 70 from the potentiometer 72 subtracted from the voltage on the divider output 66. When the potentiometer 72 is properly set, the voltage on the output 76 indicates the deviation of the height of the substrate 14 from the nominal working height for the substrate 14. The display 78 may be an analog or a digital voltage meter. The feedback controller 80 may be conventional analog or digital circuitry for producing appropriate control signals on the output 82 for driving the vertical stage actuator 28. Also, the signal on the output 76 may be digitized and stored as data in the memory of a digital computer (not shown) used in the operation of the electron beam microlithography system 12.

The block 30 is connected to an electrical ground in order to prevent the accumulation of electrical charge on the block 30 and insure that electron flux currents intercepted by the block 30 due to backscattered or secondary electrons from the substrate 14 are provided with a conductive path to ground.

Figure 2:
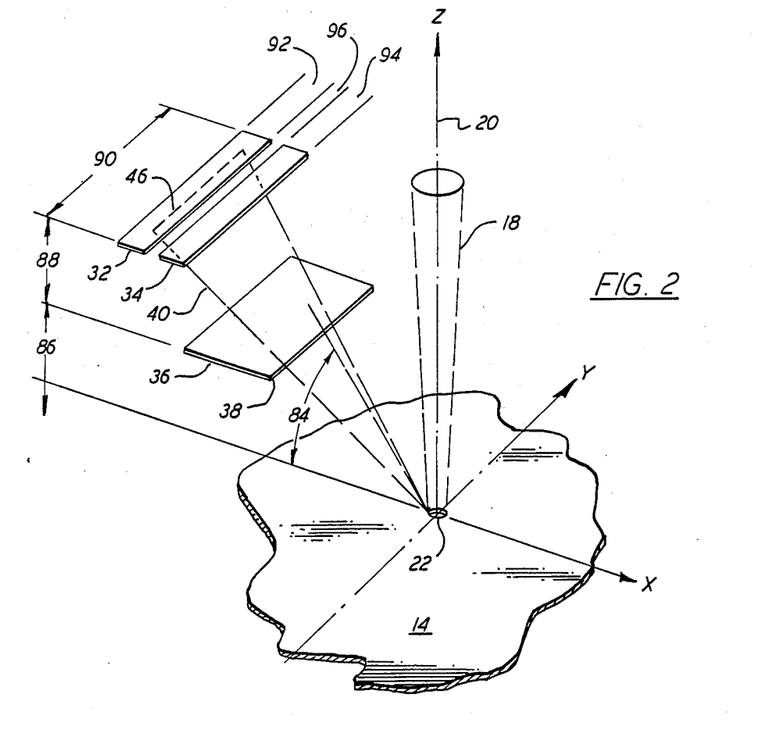
FIG. 2 is a rear perspective view of the shadow block and detectors used in the substrate height sensor of FIG. 1, and illustrating the geometry of the electron beam and backscattered electron flux.

Referring next to FIG. 2, the bombardment electron beam 18 is shown as projecting vertically downwards with its centerline 20 on the Z axis and projecting onto an impact region 22 on the upper surface of the substrate 14.

The shadow edge 38 of the shadow plate 36 is preferably positioned parallel to the Y axis and elevated at an angle 84 of approximately 45 degrees from the X axis. The plate 36 is preferably horizontal in a plane parallel to the X-Y axes, and elevated by a distance 86 of approximately 5 millimeters in the direction of the Z axis above the plane of the substrate 14. The substrate 14 is preferably horizontal in the plane of the X-Y axes. The detectors 32 and 34 are preferably elongated, parallel strips mounted horizontally in a plane parallel to the X-Y axes and elevated by a distance 88 of approximately 5 millimeters in the direction of the Z axis vertically above the plane of the shadow plate 36. The detectors 32 and 34 are preferably strips positioned parallel to the Y axis and each having a length 90 of approximately 10 millimeters. The detector 32 has a width 92 of approximately 1 millimeter. The detector 32 has a width 94 of approximately 1 millimeter. The detectors 32 and 34 are spaced apart by a separation gap 96 of approximately 0.5 millimeters.

As described previously, the measurement detector 32 is preferably positioned so that the beam edge 40 intersects the undersurface of the detector 32 along a detected edge 46 which is approximately one half the distance across the width 92 of the detector 32 when the substrate 14 is at its nominal working height. Therefore, the detector 32 is elevated at approximately the same angle (the angle 84 of approximately 45 degrees from the X axis) as the shadow plate 36.

As the substrate 14 is moved downwards in a vertical direction parallel to the Z axis, the angle 84 increases, the beam edge 40 becomes more steeply inclined, and the detected edge 46 moves forward in a direction parallel to the X axis. As the detected edge moves forward parallel to the X axis, more of the area of the undersurface of the measurement detector 32 is placed in shadow by the shadow plate 36 so that the amount of backscattered electron flux intercepted by the detector 32 decreases. Further movement of the substrate 14 downwards will cause the separation gap 96 and reference detector 34 to be placed in shadow by the shadow plate 36. However, it is preferable that the height detector 10 be operated over a limited range of heights for the substrate 14 so that the detected edge 46 is maintained on the undersurface of the measurement detector 32. Such an operating range ensures that the reference detector 34 is always fully exposed to backscattered electron flux and that the measurement detector 32 remains sensitive to variations in the height of the substrate 14 by intercepting varying amounts of backscattered electron flux in response to vertical movements of the substrate 14. The amount of backscattered electron flux intercepted by the measurement detector 32 corresponds in magnitude to the area of the undersurface of the measurement detector 32 which is exposed to backscattered electrons. The area of detector 32 which is in the shadow cast by the shadow plate 36 of the block 30 does not intercept backscattered electron flux. Therefore, the magnitude of the electrical current signal produced by the detector 32 corresponds to the size of the area of the detector 32 which is outside the shadow cast by the block 30.

For the sake of clarity, shadow producing block 30 has been omitted from FIG. 2 except for the shadow plate 36. The beam edge 40 is shown as dashed lines which are visible through the detectors 32 and 34 for purposes of illustrating the position of the detected edge 46 on the underside of the measurement detector 32.

Figure 3:
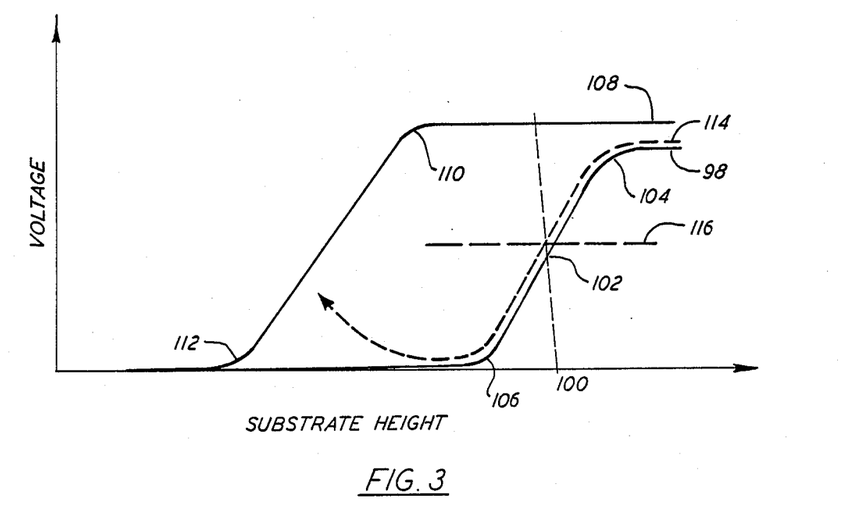
FIG. 3 is a plot of electrical current versus substrate height for both the reference and measurement detectors of the substrate height sensor of FIG. 1, and further illustrating the electrical ratio signal produced by the divider circuitry shown in FIG. 1.

Referring next to FIG. 3, waveforms representing the voltage at various points inside the circuitry of FIG. 1 versus the vertical position of the substrate 14 is shown. The measurement detector waveform 98 represents the voltage produced at the output 60 by the amplifier 52. When the substrate 14 is at its nominal working height 100, the waveform 98 is at a point 102 which is approximately midway between the minimum and maximum voltages attained by the waveform 98. When the waveform 98 reaches the point 102, the substrate 14 is at its nominal working height 100 and the detected edge 46 is approximately midway across the width 92 of the measurement detector 32 (see FIG. 2). The point 104 represents the point at which the waveform 98 first reaches its maximum voltage as the substrate 14 is raised vertically. The voltage 104 corresponds to the condition in which the measurement detector 32 is entirely exposed to backscattered electron flux and the beam edge 40 does not intersect the detector 32. The point 106 on the waveform 98 represents the point where the substrate 14 has been lowered to an extent that the measurement detector 32 is placed entirely in shadow by the shadow plate 36, and the beam edge 40 does not intersect the measurement detector 32.

The waveform 108 represents the voltage produced on the output 62 by the amplifier 54 indicating the electron flux intercepted by the reference detector 34. Note that for heights of the substrate 14 in the range between the corresponding points 104 and 106 of waveform 98, the waveform 108 remains substantially constant indicating that the reference detector 34 intercepts a substantially constant electron flux over the operating range of the height sensor 10. It is preferable that the operating range of the height sensor 10 between the points 104 and 106 accommodate the expected variations of the ±50 micrometers expected for the height of the substrate 14. The waveform point 110 on waveform 108 indicates that the point at which the substrate 14 has been lowered to such an extent that a shadow begins to appear across the reference detector 34. The waveform point 112 on waveform 108 indicates the point at which the substrate 14 has been lowered to such an extent that the reference detector 34 has been placed entirely in shadow and receives no backscattered electron flux.

When the substrate 14 is at a height between the height corresponding to point 110 on waveform 108 and the height corresponding to point 106 on waveform 98, the detected edge 46 falls inside the separation gap 96 (see FIG. 2).

The divider output waveform 114 indicates the voltage produced on the divider output 66 of FIG. 1. Because the waveform is the result of a mathematical division, the waveform 114 remains substantially constant even when the amplitude of the waveform 98 and 108 is changed due to variations in the current of the bombardment electron beam 18 or variations in the backscatter coefficient for the surface of the substrate 14. Note that the amplitude of waveforms 98 and 108 will change by comparable amounts due to such variations. and that the divider 64 serves to compensate for such variations.

A reference voltage 116 is chosen for applications to the input 70 using potentiometer 72 (see FIG. 1) such that the reference voltage 116 is equal to the amplitude of the waveform 114 when the substrate 14 is at its nominal working height 100.

Figure 4:
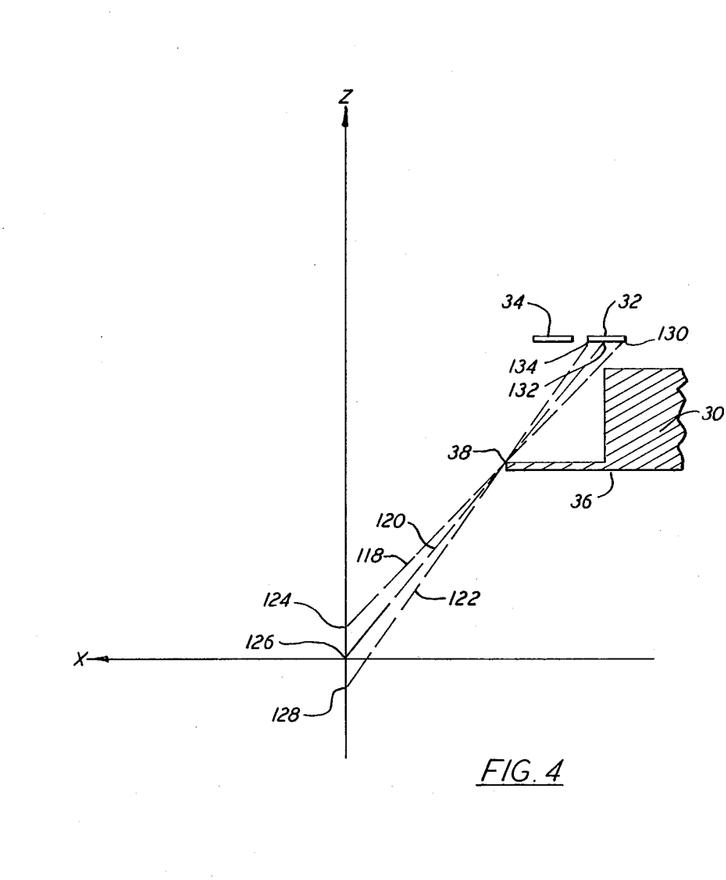
FIG. 4 is an electron beam shadow diagram for the substrate height sensor embodiment of FIG. 1 depicting the shadow position for various substrate heights.

Referring next to FIG. 4, beam edges 118, 120 and 122 indicate the boundary for backscattered electron flux passing the shadow edge 38 when the substrate 14 (see FIG. 1) is in the vertical positions 124, 126, and 128, respectively. The beam edges 118, 120 and 122 correspond to the beam edge 40 of FIGS. 1 and 2 for various heights of the substrate 14. The beam edges 118, 120 and 122 produce corresponding detected edges 130, 132, and 134 at the lines of intersection between the beam edges and the undersurface of measurement detector 32.

The vertical position 126 corresponds to the nominal working height 100 shown in FIG. 3 for the substrate 14. The detected edge 132 is produced by the beam edge 120 when the substrate 14 is at the nominal height 126. The detected edge 132 is approximately midway across the width of the measurement detector 32 so that approximately one half of the area of the underside of detector 32 is exposed to electron flux. As the substrate 14 is moved upwards to the vertical position 124, backscattered electrons are allowed by the shadow edge 38 to move further across the width 92 of the detector 32 and reach the detected edge 130 so that the entire area of the underside of the detector is exposed to backscattered electron flux. As the substrate 14 is lowered to the vertical position 128, the shadow edge 38 casts more of a shadow across the measurement detector 32. When the substrate 114 is lowered to the point 128, the beam edge 122 defines a detected edge 134 on the end of the detector 32 so that the detector 32 is entirely in shadow and receives no backscattered electron flux.

When the substrate 14 is in the position 128, a minimum measurement detector output signal is produced on the output 60 as shown at the point 106 on waveform 98 in FIG. 3. When the substrate 14 is at its nominal working height 126, the measurement detector output on output 60 is at the point 102 in waveform 98 of FIG. 3. When the substrate 14 is in the vertical position 124, the measurement detector output on output 60 is at its maximum value as shown by the point 104 on the waveform 98 of FIG. 3.

Figure 5:
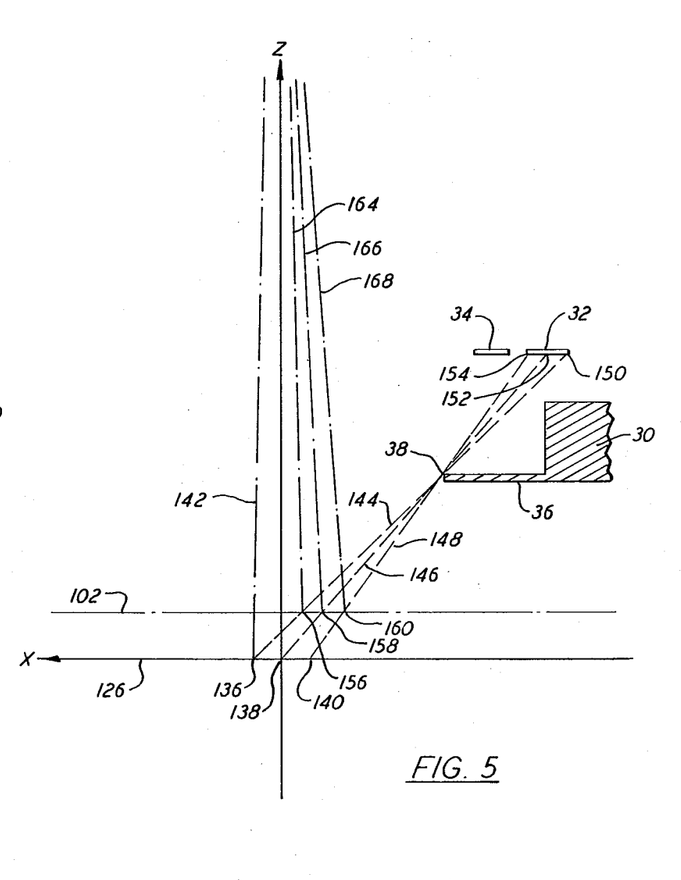
FIG. 5 is an electron beam shadow diagram for the substrate height sensor of FIG. 1 illustrating the shadow position variations produced by scanning the electron beam laterally.

Referring next to FIG. 5, the electron beam 18 (see FIGS. 1 and 2) is directed downwards with its centerline 20 nominally along the Z axis and may be deflected horizontally along the X axis by deflection plates (not shown) in the electron optics column 16. The horizontal positions 136, 138, and 140 correspond to the position of the impact region 22 (see FIGS. 1 and 2) for the case in which the substrate 14 is at its nominal working height with its upper surface along the X axis of FIG. 5. The electron beam 18 is scanned or deflected horizontally across the substrate 14 in the X axis direction in order to traverse the distance between the horizontal positions 136, 138, and 140. The centerline of the electron beam 18 is along the line 142 when the substrate 14 is at its nominal operating height and the beam 18 is focused on the impact region 22 at the horizontal position 136.

The beam edges 144, 146, and 148 indicate the boundary for backscattered electron flux passing the shadow edge 38 when the electron beam 18 has its impact region 22 at the horizontal locations 136, 138, and 140 respectively. The beam edges 144, 146, and 148 produce corresponding detected edges 150, 152, and 154 at the lines of intersection between the beam edges and the undersurface of measurement detector 32.

The detected edges 150, 152, and 154 have the same positions as the detected edges 130, 132, and 134, respectively of FIG. 4. Therefore, changes in the vertical position of the substrate 14 by moving the substrate 14 between the vertical positions 124, 126, and 128 as shown in FIG. 4 produces the same movement of a detected edge across the measurement detector 32 as scanning the electron beam 18 horizontally across the substrate 14 between the horizontal positions 136, 138, and 140 as shown in FIG. 5. The operation of the deflection plates (not shown) in the electron optics column 16 is precisely controlled to produce known, calibrated horizontal deflections of the electron beam. Therefore, the height sensor 10 may be calibrated also by horizontally deflecting the beam 18 by known distances and measuring the changes in electron flux intercepted by the detectors 32 and 34. Note that since the angle 84 (see FIG. 2) is approximately 45 degrees, then a horizontal deflection of the beam 18 of a specified distance produces substantially the same change in the signal on output 76 as a vertical displacement of the substrate 14 by the same specified distance.

When the substrate 14 is moved vertically upwards to the vertical position 162, the electron beam 18 must produce an impact region 22 which moves between the horizontal positions 156, 158, and 160 in order to produce a backscattered electron shadow moving between the detected edges 150, 152, and 154, respectively. The beam 18 moves between the centerlines 164, 166, and 168 in order to move the impact region 22 between the horizontal positions 156, 158, and 160.

Figure 6:
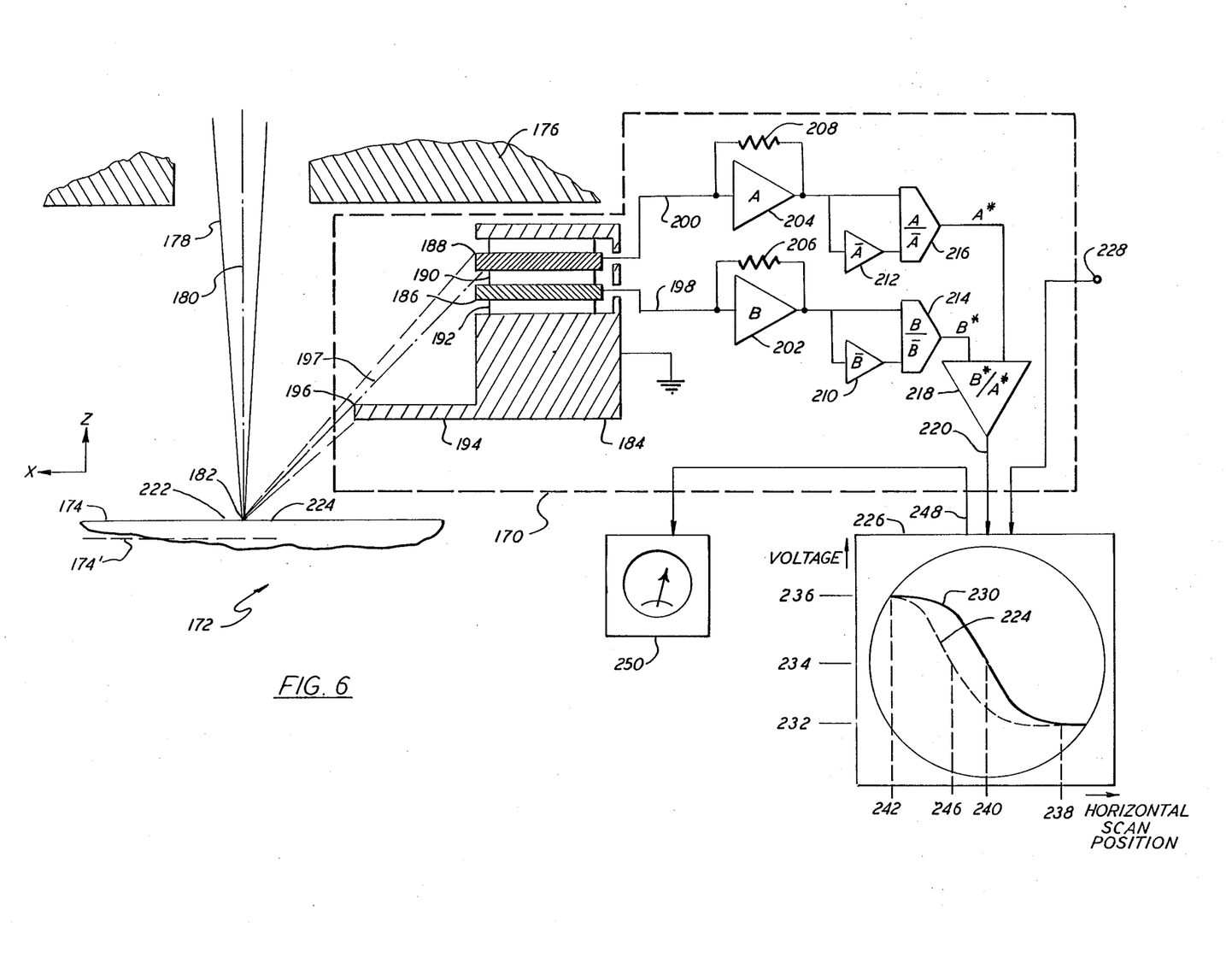
FIG. 6 is a partially cut away elevational view of an alternative embodiment substrate height sensor used in an electron beam microlithography system, and further showing an electrical schematic diagram for circuitry used in the height sensor and illustrating a voltage versus horizontal scan position diagram for the output produced by the height sensor.

Referring next to FIG. 6, the height sensor 170 is used in the electron beam lithography system 172 in order to measure the distance between the substrate 174 and the electron beam optics column 176. The height sensor 170 performs the same function as the height sensor 10 of FIG. 1. A bombardment electron beam 178 having a centerline 180 projects electrons on the upper surface of the substrate 174 in an impact region.

The height sensor 170 includes a shadow producing block 184 with a measurement detector 186 and reference detector 188 mounted thereon. It is preferable that the measurement detector 186 and reference detector 188 be mounted securely on the block 184 and that the block 184 be rigidly fixed in place to prevent movement between the optics column 176 and the height sensor 170. It is preferable that the measurement detector 186 and reference detector 188 be composed of 50 micrometer thick tantalum metallic foil sheets separated by an electrically insulating layer 190 and separated from the block 184 by an electrically insulating layer 192. It is preferable that the layers 190 and 192 be 50 micrometers thick using, for example, drafting paper or perhaps Mylar. It is preferable that the block 184 be composed of molybdenumm and be coated with electrically conductive silver metallic paint. The purpose of the layers 190 and 192 is to electrically insulate the detectors 186 and 188 from each other and from the block 184.

The block 184 includes a shadow plate 194 projecting from the block 184 and having a shadow edge 196 which defines a beam edge 197 in the backscattered and secondary electrons traveling from the substrate 174.

The block 184 performs a function analogous to the block 30 of FIG. 1. The detectors 186 and 188 perform functions analogous to the detectors 32 and 34 of FIG. 1; except that the detectors 186 and 188 are placed one above the other vertically and the detectors 32 and 34 are positioned side by side in a horizontal plane.

The detectors 186 and 188 collect electron flux to produce currents in the wires 198 and 200, respectively. It is preferable that the wires 198 and 200 be in a twisted pair coaxial cable having its shield grounded to prevent noise pickup. Similarly, the block 184 is preferably grounded. The wires 198 and 200 are connected as inputs to amplifiers 202 and 204, respectively, which are also coupled with gain determining feedback resistors 206 and 208. The outputs of amplifiers 202 and 204 are coupled to integrators 210 and 212 whose outputs are, in turn, coupled to dividers 214 and 216. The output signals denoted $\overline{B}$ and $\overline{A}$ from integrators 210 and 212 are time averaged signals and these integrators also serve as an automatic gain control. The outputs of amplifiers 202 and 204 are also coupled directly to the dividers 214 and 216. For convenience, the outputs of dividers 214 and 216 are denoted signal B* and signal A*, respectively. Divider 218 has its inputs connected to the outputs of dividers 214 and 216, and produces an output on the line 220. The divider 218 is connected to divide the signal received from amplifier 214 (B*) by the signal received from amplifier 216 (A*) to produce an output signal (B\*/A\*) on the line 220. Amplifiers 202 and 204 are conventional operational amplifiers, integrators 210 and 212 are conventional analog integrators, and divider 218 is a conventional analog divider. The output signal on the output line 220 is substantially independent of the current in the beam 178, and is also independent of irregularities in the upper surface of substrate 174 or variations in the backscatter coefficient caused by either surface texture variations on the upper surface of substrate 174 or composition variations on the upper surface of substrate 174.

The substrate 174 may be lowered along the Z axis to a vertically lower position denoted 174'.

The electron beam 178 may be scanned back and forth horizontally using deflection plates (not shown) in the optics column 176 in order to move the impact region 182 back and forth across the upper surface of the substrate 174 in a direction parallel to the X axis and between the locations 222 and 224.

An analyzer 226 is connected to the output line 220 to receive the output signal from divider 218 and is also connected to synchronization line 228 to receive a signal from the optics column 176 corresponding to the horizontal deflection or scanning of the electron beam 178. The analyzer 226 preferably comprises conventional analog circuitry and may include an oscilloscope screen for displaying the voltage produced by output line 220 on a vertical axis and the signal received on the synchronization line 228 on a horizontal axis. Such a display for the substrate 174 at its nominal working height is shown by the waveform 230 which spans between a vertical minimum 232, a vertical midpoint 234, and a vertical maximum 236. The corresponding horizontal crossovers for the waveform 230 are the minimum 238, midpoint 240 and maximum 242 horizontal crossovers.

When the substrate 174 is lowered to the position denoted 174' the waveform 244 is produced on an oscilloscope screen by the analyzer 226, and the waveform 244 has a midpoint horizontal crossover 246. The distance between the midpoint crossovers 240 and 246 is indicative of the vertical distance between the nominal working height for substrate 174 and the vertical position denoted 174'. That is, the position of the midpoint horizontal crossover corresponds to the vertical height of the substrate 174. The analyzer 226 produces a signal on the output line 248 which is responsive to the position of the midpoint horizontal crossover (such as 240 and 246). The display 250 is connected to the output line 248 in order to provide a visual indication of the height of the substrate 174.

When the substrate 174 is at its nominal working height, as the electron beam 178 is scanned between the positions 222 and 224, the voltage on the output line 220 follows the waveform 230. The horizontal crossover 242 corresponds to the impact region 182 at the scan location 222. The horizontal crossover 238 corresponds to the beam 178 being directed so that the impact region 182 is at the scan location 224.

Figure 7:
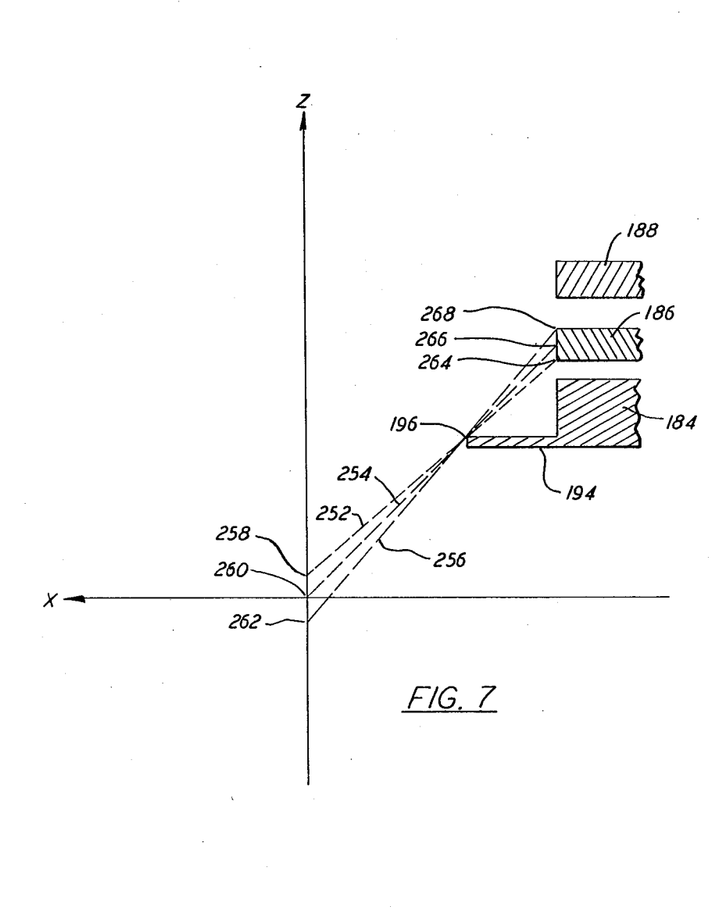
FIG. 7 is an electron beam shadow diagram illustrating the position of the shadow for the embodiment of FIG. 6 for various substrate heights.

Referring next to FIG. 7, beam edges 252, 254, and 256 are defined by the shadow edge 196 when the substrate 174 is in the vertical positions 258, 260 and 262, respectively. The detected edges 264, 266, and 268 mark the positions of intersection between the face of the measurement detector 186 and the electron beam edges 252, 254, and 256, respectively. Backscattered electron flux is collected by the measurement detector 186 in a very similar manner to that described for measurement detector 32 and illustrated by FIG. 4. As the shadow cast on the measurement detector 186 by the shadow edge 196 moves from the detected edge 264, through detected edge 266 and to detected edge 268, the backscattered electron flux collected by detector 186 decreases and the electrical current provided by detector 186 to the amplifier 202 (see FIG. 6) also decreases in magnitude. FIG. 7 illustrates that the placement of a reference detector 188 vertically above a measurement detector 186 can be used in a height sensor 170 to perform the same function as a reference detector 34 placed in the same horizontal plane as a measurement detector 32 in the height sensor 10 of FIG. 1.

Figure 8:
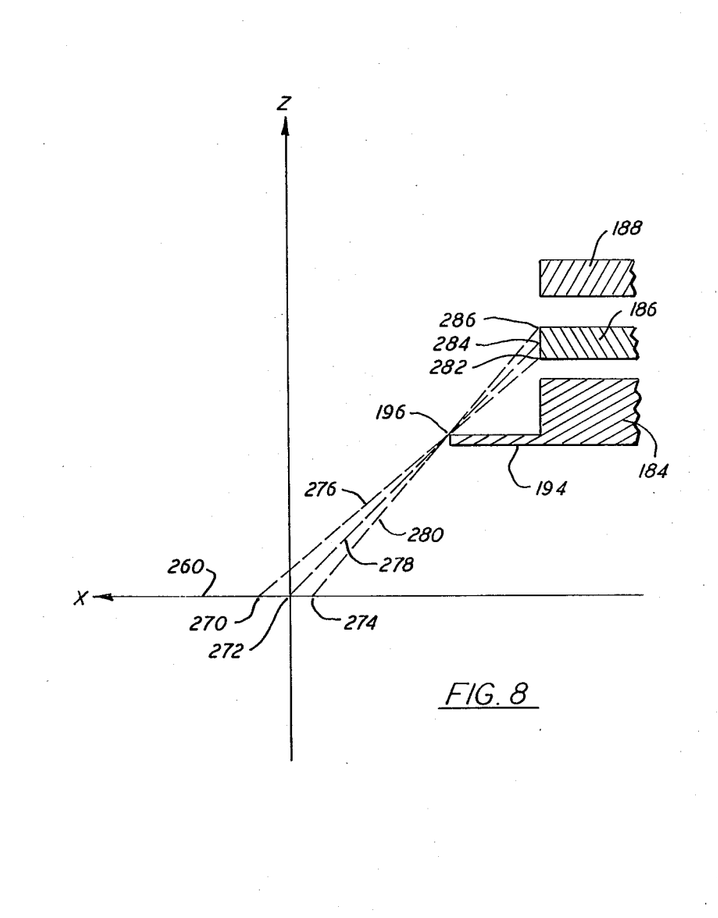
FIG. 8 is an electron beam shadow diagram for the height sensor embodiment of FIG. 6 depicting the position of the electron beam shadow for horizontal deflections of the electron beam.

Referring next to FIG. 8, the electron beam 178 is scanned horizontally by the optics column 176 to move the beam 178 impact region 182 between the horizontal positions 270, 272, and 274. The shadow edge 196 produces the beam edges 276, 278 and 280 in the backscattered and secondary electron flux produced as the impact region 182 is in the horizontal positions 270, 272, and 274, respectively. The beam edges 276, 278, and 280 intersect the measurement detector 186 face at the detected edges 282, 284, and 286, respectively.

The detected edges 282, 284, and 286 are in the same positions on the face of the measurement detector 186 as the detected edges 264, 266, and 268, respectively, shown in FIG. 7. This illustrates that horizontal scanning of the electron beam 178 as illustrated in FIG. 8 produces an equivalent effect in the backscattered electron flux intercepted by measurement detector 186 as is produced by the vertical movement of the substrate 174 depicted in FIG. 7. FIG. 8 further illustrates the equivalent performance of the alternative embodiment shown in FIG. 6 to the performance of the preferred embodiment shown in FIG. 1 for horizontal scanning of an electron beam as illustrated by FIG. 5.

Alternative constructions may be used to produce equivalent height sensors without departing from the spirit of this invention; the scope of which is defined by the appended claims. For example, measurement and reference detectors may be made using metal electrodes, P/N diodes, scintillation detectors coupled to photomultiplier tubes, and equivalent electron flux detectors. The height sensor may be used in systems other than an electron microscope or the electron beam lithography system described. Particles other than electrons may be used in the system.

We claim:

1. A sensor for use in determining the position of a substrate which is bombarded by a beam from a source of charged particles, wherein charged particles are backscattered from said substrate, said sensor comprising:

a shadow edge positioned adjacent said substrate to cast a shadow by obstructing the flux of charged particles backscattered from said substrate, said shadow edge being fixed in space relative to the source of said charged particle beam to produce a shadow which moves in response to the position of said substrate; and a charged particle measurement detector having a detector surface area for intercepting the flux of charged particles backscattered from said substrate, said measurement detector being fixed in space relative to the source of said charged particle beam and said shadow edge, and said measurement detector being positioned with said detector surface area having a first area portion exposed to said backscattered particles and a second area portion in said shadow, said measurement detector having a measurement detector output providing an electrical measurement detector signal corresponding to the size of said first area portion so that said measurement signal varies in accordance with the movement of said shadow as said substrate is moved.

2. The sensor of claim 1 further comprising a charged particle reference detector for detecting charged particles backscattered by said substrate, said reference detector being fixed in space relative to said source of charged particles, said shadow edge, and said measurement detector, said reference detector being positioned outside of the shadow of said shadow edge, and said reference detector having a reference detector output providing an electrical reference detector signal which is substantially insensitive to the movement of said shadow.

3. The sensor of claim 1 wherein said measurement detector comprises a P/N diode backscatter electron detector having an energy sensitivity adapted to selectively reject the detection of secondary electrons emitted from said substrate.

4. The sensor of claim 2 wherein both said measurement detector and reference detector comprise P/N diode backscatter electron detectors having an energy sensitivity adapted to selectively reject the detection of secondary electrons emitted from said substrate.

5. The sensor of claim 2 further comprising a divider circuit having a first input coupled to said measurement detector output, having a second input coupled to said reference detector output, and having an output proportional to the ratio of the signal provided on said first input to the signal provided on said second input.

6. The sensor of claim 2 further comprising means for suppressing the effect of substrate scattering coefficient variations, substrate texture variations, and beam intensity variations.

7. The sensor of claim 5 further comprising a comparator circuit having a first comparator input coupled to said divider circuit output, having a second comparator input coupled to a reierence source, and having a comparator output for providing a signal proportional to the difference between the signal from said reference source.

8. The sensor of claim 5 further comprising means for extracting an error signal indicating the deviation of the height of said substrate from a nominal substrate height.

9. The sensor of claim 8 wherein said means for extracting comprises a voltage comparator circuit having a first input coupled to said divider circuit output, having a second input coupled to a reference signal, and having an output for providing a signal proportional to the difference between said divider output and said reference signal.

10. The sensor of claim 2 wherein said measurement detector and said reference detector are arranged in a plane parallel to said charged particle beam.

11. The sensor of claim 2 wherein said measurement detector and said reference detector are arranged in a plane perpendicular to said charged particle beam.

12. The sensor of claim 1 wherein said charged particle beam comprises an electron beam.

13. The sensor of claim 1 wherein said measurement detector comprises a metallic plate.

14. The sensor of claim 2 wherein said measurement detector and said reference detector comprise parallel metallic strips which are spaced apart and which extend perpendicular to said charged particle beam.

15. Tbe sensor of claim 1 further comprising a metal plate mounted perpendicular to said charged particle beam to provide said shadow edge.

16. An electron beam exposure system having a substrate holder for holding a substrate, an electron beam source for projecting an electron beam onto the substrate, and further comprising:
a shadow plate to intercept electrons backscattered from the substrate and to cast a shadow in the backscattered electrons;
an electron detector having a width, and positioned such that the shadow is cast intermediate across the detector width and so that the shadow moves across the width of the detector as the distance between the electron source and the substrate changes, the detector operating to produce a detector output signal corresponding to the flux of backscattered electrons impinging on the detector;
electronic circuitry coupled to the electron detector, and responsive to the detector output signal to produce an indication of the distance between the substrate and the electron beam source.

17. An electron beam exposure system having a movable stage for holding a substrate thereon, an electron beam source for projecting an electron beam onto the substrate, and further comprising;
a shadow plate to intercept electrons backscattered from the substrate and to cast a shadow in the backscattered electrons;
an electron detector having a width, and positioned so that the shadow is cast intermediate across the detector width and so that the shadow moves across the width of the detector as the distance between the electron source and the substrate changes, the detector operating to produce a detector output signal corresponding to the flux of backscattered electrons impinging on the detector;
means for moving the stage towards and away from the electron source in response to motion control electronic signals;
electronic circuitry coupled to the detector, to produce the motion control electronic signals in response to the detector output signal produced by the detector, so that the substrate is moved by the stage to a preferred distance from the electron source.

18. An electron beam exposure system having a substrate holder for holding a substrate thereon, a focusable electron beam source for projecting an electron beam onto the substrate with the focus of the beam being responsive to a beam focusing electronic signal, and further comprising;
a shadow plate to intercept electrons backscattered from the substrate and to cast a shadow in the backscattered electrons;
an electron detector having a width, and positioned so that the shadow is cast intermediate across the detector width and so that the shadow moves across the width of the detector as the distance between the electron source and the substrate changes, the detector operating to produce a detector output signal corresponding to the flux of backscattered electrons impinging on the detector;
electronic circuitry coupled to the detector, to produce the beam focusing electronic signal responsive to the detector output signal in order to produce a focus for the beam appropriate to the distance between the substrate and the beam source.

* * * * *